United States Patent
Krautschneider et al.

(10) Patent No.: US 6,521,935 B2
(45) Date of Patent: Feb. 18, 2003

(54) MOS TRANSISTOR AND DRAM CELL CONFIGURATION

(75) Inventors: Wolfgang Krautschneider, Hamburg (DE); Till Schlösser, Dresden (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/027,524

(22) Filed: Dec. 26, 2001

(65) Prior Publication Data

US 2002/0096699 A1 Jul. 25, 2002

Related U.S. Application Data

(63) Continuation of application No. PCT/DE00/01740, filed on May 29, 2000.

(30) Foreign Application Priority Data

Jun. 25, 1999 (DE) ............................ 199 29 211

(51) Int. Cl.⁷ ............... H01L 27/108; H01L 29/76; H01L 29/94; H01L 31/119
(52) U.S. Cl. ............ 257/296; 257/298; 257/300; 257/301; 257/330; 438/242; 438/243; 438/206; 438/253
(58) Field of Search ............ 257/296, 302, 257/300, 301, 306, 398, 330; 438/242, 243, 244, 206, 253, 254

(56) References Cited

U.S. PATENT DOCUMENTS

| 5,034,341 | A | * | 7/1991 | Itoh ................. 438/242 |
|---|---|---|---|---|
| 5,227,660 | A | | 7/1993 | Horiuchi et al. |
| 5,252,849 | A | * | 10/1993 | Fitch et al. ............ 257/329 |
| 5,414,289 | A | * | 5/1995 | Fitch et al. ............ 257/296 |
| 5,559,368 | A | | 9/1996 | Hu et al. |
| 5,907,170 | A | * | 5/1999 | Forbes et al. ........... 257/296 |
| 5,973,373 | A | * | 10/1999 | Krautschneider et al. ... 257/390 |
| 6,072,209 | A | * | 6/2000 | Noble et al. ............ 257/296 |
| 6,087,692 | A | * | 7/2000 | Gobel et al. ............ 257/300 |
| 6,097,049 | A | * | 8/2000 | Goebel et al. .......... 257/296 |
| 6,229,169 | B1 | * | 5/2001 | Hofmann et al. ........ 257/296 |

OTHER PUBLICATIONS

Assaderaghi, F. et al.: "Dynamic Threshold–Voltage MOSFET (DTMOS) for Ultra–Low Voltage VLSI", IEEE, vol. 44, No. 3, Mar. 1997, pp. 414–421.

Risch, L. et al.: "Vertical MOS Transistors with 70 nm Channel", Proceedings of the European Solid State Device Research Conference (ESSDERC), pp. 102–104.

* cited by examiner

Primary Examiner—David Nelms
Assistant Examiner—Andy Huynh
(74) Attorney, Agent, or Firm—Laurence A. Greenberg; Werner H. Stemer; Ralph E. Locher

(57) ABSTRACT

A MOS transistor includes an upper source/drain region, a channel region, and a lower source/drain region that are stacked as layers one above the other and form a projection of a substrate. A gate dielectric adjoins a first lateral area of the projection. A gate electrode adjoins the gate dielectric. A conductive structure adjoins a second lateral area of the projection in the region of the channel region. The conductive structure adjoins the gate electrode.

8 Claims, 4 Drawing Sheets

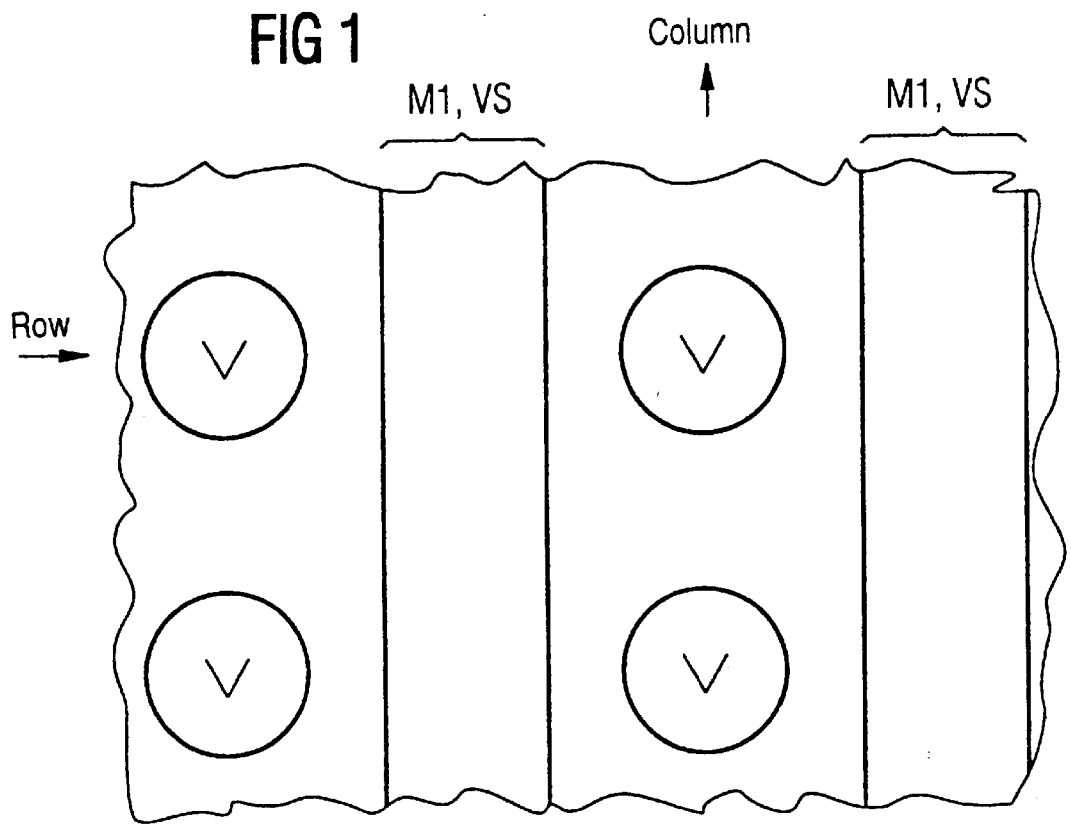
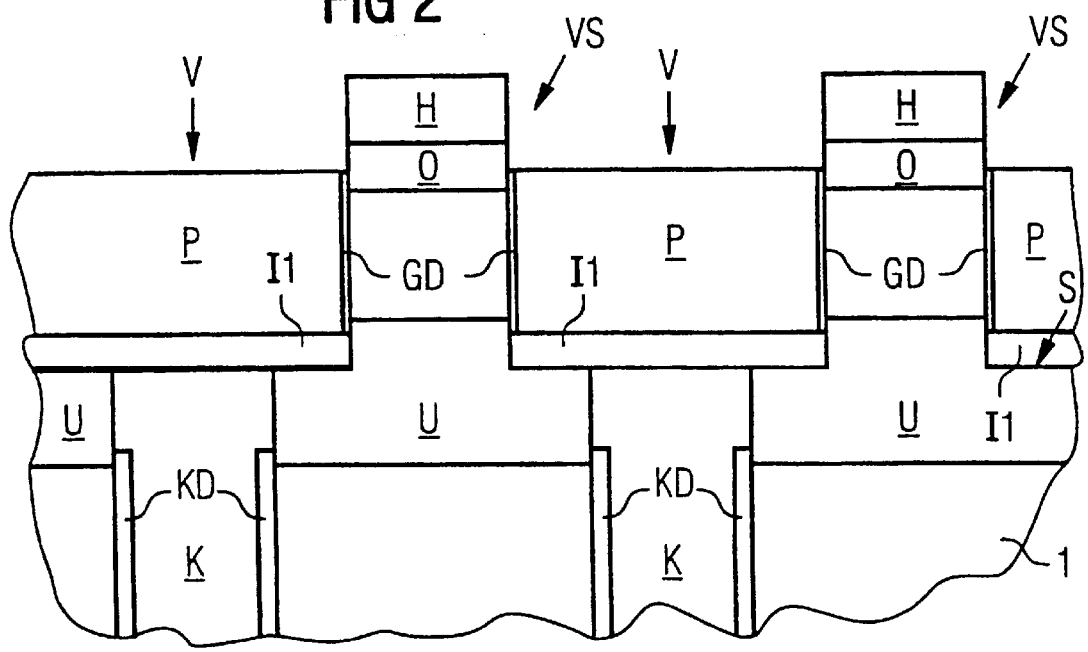

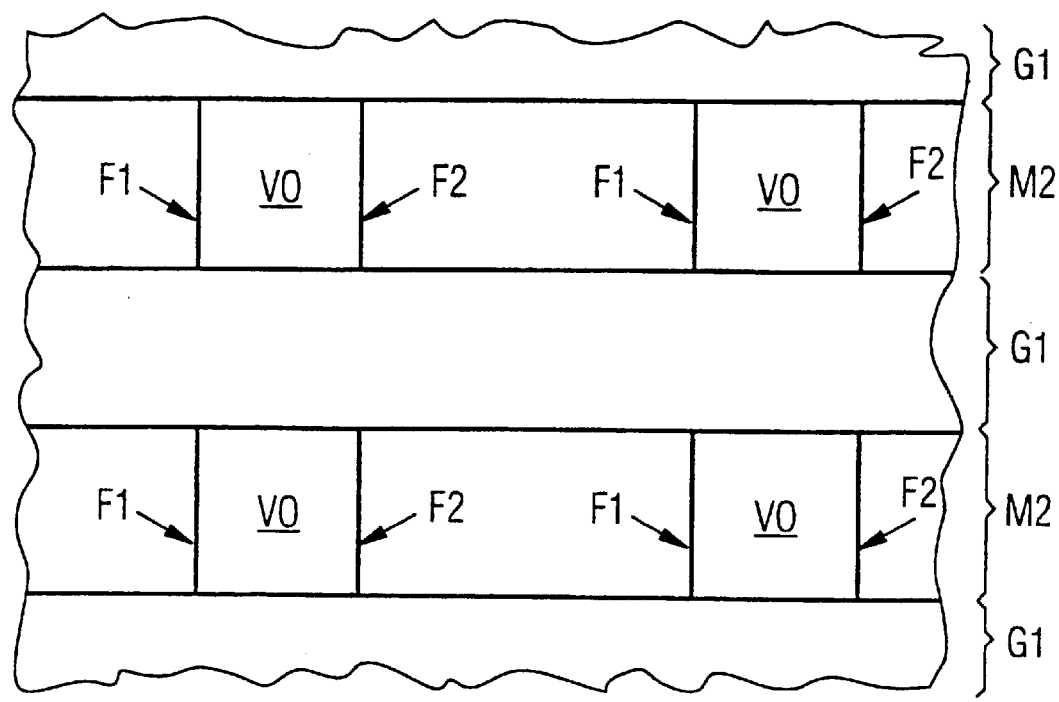
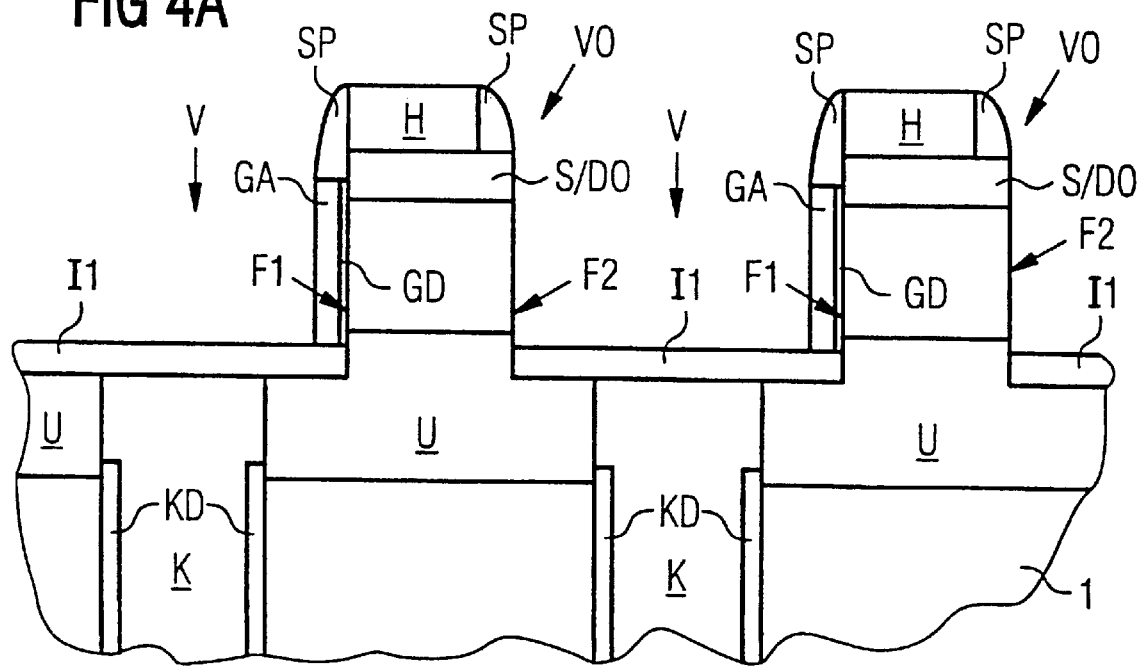

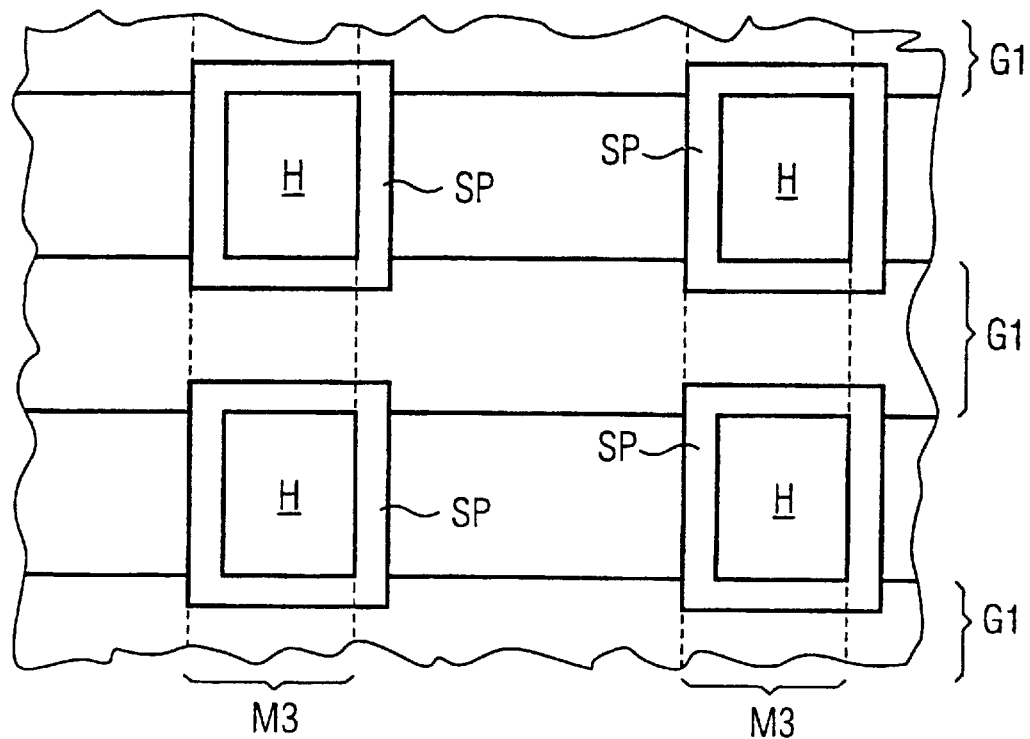
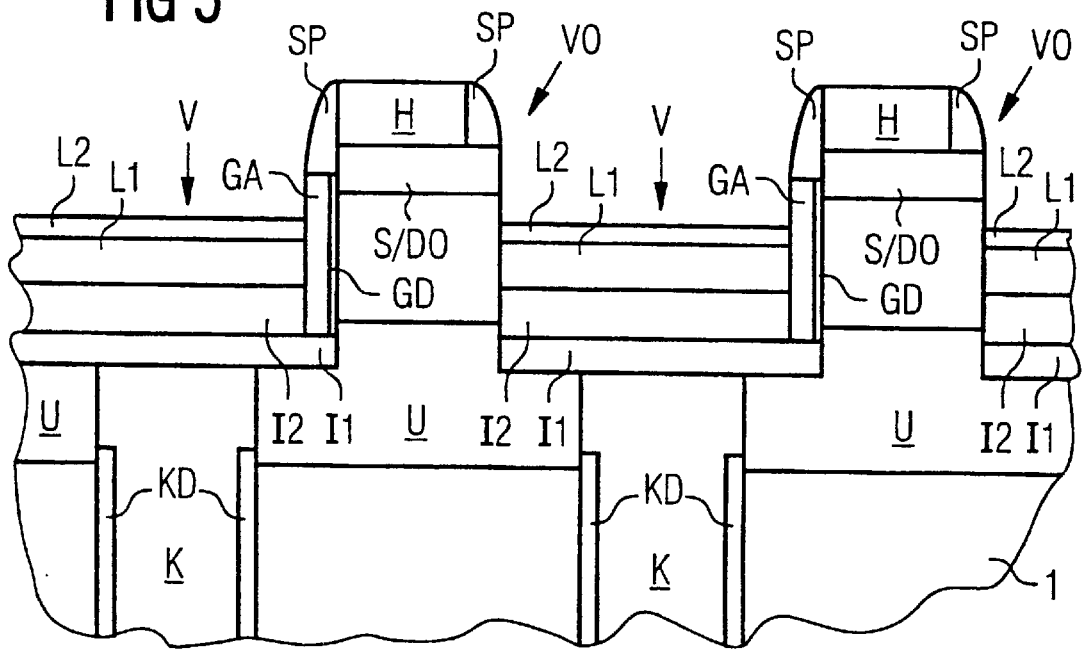

MOS TRANSISTOR AND DRAM CELL CONFIGURATION

CROSS-REFERENCE TO RELATED APPLICATION

This application is a continuation of copending International Application No. PCT/DE00/01740, filed May 29, 2000, which designated the United States.

BACKGROUND OF THE INVENTION

Field of the Invention

The invention relates to a MOS transistor and a DRAM cell configuration having such a MOS transistor.

Presently, MOS transistors are usually realized using planar silicon technology, in which source, channel, and drain are disposed laterally. In such a case, the channel lengths that can be achieved are dependent on the resolution of the optical lithography used and on tolerances in the patterning and alignment.

MOS transistors are used, for example, in dynamic random access memory (DRAM) cell configurations. At the present time, use is made almost exclusively of a so-called one-transistor memory cell, including a MOS transistor and a capacitor, as the memory cell of a DRAM cell configuration. The information of the memory cell is stored in the form of a charge on the capacitor. The capacitor is connected to the transistor such that, when the transistor is driven through a word line, the charge of the capacitor can be read out through a bit line.

It is generally endeavored to produce a DRAM cell configuration that has a high packing density. To that end, it is advantageous to configure the MOS transistor as a vertical transistor, in which source, channel region, and drain are disposed one above the other. Such a MOS transistor can have a small space requirement independently of a channel length.

Such a MOS transistor is disclosed for example in L. Risch et al. "Vertical MOS Transistors with 70 nm Channel Lengths", ESSDERC (1995), proceedings of the European Solid State Device Research Conference (ESS-DERC) Gil-Sur-Yette, France, pages 101 to 104. The lower source/drain region of the MOS transistor adjoins a surface of a substrate. Disposed on the lower source/drain region are a channel region and an upper source/drain region, which form a projection of the substrate. The projection is provided with a gate dielectric. A gate electrode of the MOS transistor laterally surrounds the projection. What is disadvantageous about such a MOS transistor is, in particular, the channel region that is insulated from the substrate and in which charge carriers can accumulate and alter the threshold voltage. Such a configuration leads to the so-called floating body effects.

U.S. Pat. No. 5,907,170 to Forbes et al. relates to a DRAM with an open bit line concept, a memory cell including a vertical selection transistor and a trench capacitor. The selection transistor is formed in a pillar that includes a layer sequence formed by lower source/drain region, body region, and upper source/drain region. A gate that controls the transistor is disposed on one side of the pillar. On the opposite side, a body contact is disposed on the body region. The body contact is connected to a body line. The gate is connected to a word line. The word line and the body line are routed separately through the entire cell array and are connected to a row decoder that drives the word line and the body line.

U.S. Pat. No. 5,559,368 to Chenming et al. discloses MOS field-effect transistors that are formed with a dynamic threshold voltage. For such a purpose, the body contact and the gate are electrically connected to one another so that very low threshold voltages can be realized. To implement the configuration, in the planar field effect transistor shown therein, contact holes are formed at the end of the channel width and realize an electrically conductive contact between the gate and the body region.

S. Assaderaghi et al., "Dynamic Threshold-Voltage MOS-FET (DTMOS) for Ultra-Low Voltage VLSI", IEEE Transactions on Electron Devices, Vol. 44, No. 3, (1997), 414, discloses a planar MOS transistor in which the channel region is electrically connected to the gate electrode of the MOS transistor. (As used here and below, channel region actually means the body of the MOS transistor, i.e., the semiconductor material that adjoins a source/drain region and the channel of the transistor and is doped by a conductivity type opposite to the conductivity type of the source/drain region. Thus, the channel itself is not electrically connected to the gate electrode.) The connection results in a variable threshold voltage of a transistor. In general, the threshold voltage of a transistor depends on the voltage difference between a source/drain region and the channel region. If the MOS transistor disclosed is not driven, which, as a rule, means that 0 volts is present at the gate electrode and, due to the connection, also at the channel region, then the voltage difference between the source/drain region and the channel region is greater than if the MOS transistor is driven, which means that the operating voltage is present at the gate electrode and, hence, the channel region. Consequently, the threshold voltage of the MOS transistor is larger in the event of non-driving than in the event of driving. The large threshold voltage in the event of non-driving of the MOS transistor brings about particularly small leakage currents. The small threshold voltage in the event of driving of the MOS transistor makes it possible to use a low operating voltage.

SUMMARY OF THE INVENTION

It is accordingly an object of the invention to provide a MOS transistor and method for fabricating it, and DRAM Cell configuration and method for fabricating it that overcomes the hereinafore-mentioned disadvantages of the heretofore-known devices and methods of this general type and that provides a MOS transistor configured as a vertical transistor and in which floating body effects are avoided. The invention provides a method for fabricating such a MOS transistor. The invention also provides a DRAM cell configuration in which such a MOS transistor is used, and also a method for fabricating such a DRAM cell configuration.

With the foregoing and other objects in view, there is provided, in accordance with the invention, a MOS transistor including a substrate, an upper source/drain region, a body region, a lower source/drain region, the upper source/drain region, the body region, and the lower source/drain region stacked as layers one above another and forming a projection of the substrate, the projection having a first lateral area and a second lateral area disposed opposite the first lateral area with respect to the projection, a gate dielectric adjoining the first lateral area, a gate electrode adjoining the gate dielectric, a patterned conductive structure adjoining the second lateral area at a portion of the body region and adjoining the gate electrode, and the conductive structure forming a conductive connection between the body region and the gate electrode.

Because the channel region is electrically connected to the gate electrode through the conductive structure, charge carriers generated in the channel region can flow away. Floating body effects are thereby avoided.

The MOS transistor additionally has a variable threshold voltage, which is likewise attributable to the connection of the channel region to the gate electrode. If the MOS transistor is not driven, a voltage difference between the channel region and one of the source/drain regions is particularly high so that the MOS transistor has a particularly high threshold voltage, which leads to fewer leakage currents. If the MOS transistor is driven, then a voltage difference between the channel region and the source/drain region is smaller so that the MOS transistor has a smaller threshold voltage and can be operated with a small operating voltage.

The projection may have, for example, a quadrangular horizontal cross-section, that is to say, a cross-section parallel to a surface of the substrate. The cross-section may be, for example, rectangular or square. However, the horizontal cross-section may also assume any other form. For example, the horizontal cross-section can be an ellipse or a circle. In such a case, the first lateral area and the second lateral area merge with one another without any edges.

If the horizontal crossed section of the projection is quadrangular, then the first lateral area of the projection is preferably opposite the second lateral area of the projection so that the conductive layer or the conductive structure does not make contact with the channel. The conductive structure may laterally surround the projection. To isolate the conductive structure from two further lateral areas of the projection, the two further areas, which are opposite one another, are each provided with an insulation.

In accordance with another feature of the invention, the projection has two further lateral areas each opposite one another with respect to the projection, the two further lateral areas each have an insulation, the conductive structure is patterned to laterally surround the projection, and the insulation isolates the conductive structure from the two further lateral areas.

In accordance with a further feature of the invention, the conductive structure is a conductive layer.

With the objects of the invention in view, there is also provided a DRAM cell configuration including memory cells each having a MOS transistor having a substrate, an upper source/drain region, a body region, a lower source/drain region, the upper source/drain region, the body region, and the lower source/drain region stacked as layers one above another and forming a projection of the substrate, the projection having a first lateral area, a second lateral area disposed opposite the first lateral area with respect to the projection, a third lateral area having an insulation, and a fourth lateral area having an insulation, the fourth lateral area disposed opposite the third lateral area with respect to the projection, a gate dielectric adjoining the first lateral area, a gate electrode adjoining the gate dielectric, a patterned conductive structure laterally surrounding the projection, isolated from the third and fourth lateral areas by the insulation, adjoining the second lateral area at a portion of the body region, and adjoining the gate electrode, and the conductive structure forming a conductive connection between the body region and the gate electrode, and a capacitor connected to the MOS transistor; the projection of each of the memory cells disposed in rows and columns, a word line running parallel to the columns, the word line having parts, and the parts including the conductive structure and the gate electrode of the MOS transistor of the memory cells disposed along a respective one of the columns.

In accordance with an added feature of the invention, the substrate has a surface, the lower source/drain region has a portion, the portion is disposed below the projection and adjoins the surface, isolation trenches run substantially parallel to one another, the isolation trenches isolate the lower source/drain region of one of the memory cells adjacent another of the lower source/drain region of another of the memory cells transversely with respect to the isolation trenches, the substrate has a depression between two mutually adjacent ones of the isolation trenches, the capacitor has a capacitor dielectric and a storage node, the depression has an upper region, includes the capacitor dielectric, and is filled with the storage node, and the storage node adjoins the portion of the lower source/drain region in the upper region of the depression.

In accordance with an additional feature of the invention, the lower source/drain regions adjacent to one another along the isolation trenches are isolated from one another by the depression.

In accordance with yet another feature of the invention, there are provided further isolation trenches. The further isolation trenches run transversely with respect to the isolation trenches, cut through the upper region of the depression of the memory cells, and are disposed offset with respect to the depression of the memory cells such that the storage node of a given memory cell of the memory cells adjoins the lower source/drain region of the given memory cell in the upper region of the depression in the given memory cell and the storage node is isolated from the substrate.

In accordance with yet a further feature of the invention, each of the isolation trenches runs along one of the rows, each of the columns extend in a given direction, and the first lateral area substantially lies in a plane disposed in the given direction.

With the objects of the invention in view, there is also provided a method for fabricating a MOS transistor including the steps of forming a substrate with a projection having a first lateral area and a second lateral area disposed opposite the first lateral area with respect to the projection, producing, in the projection as layers stacked one above the other, an upper source/drain region, a body region, and a lower source/drain region of a MOS transistor, providing a gate dielectric at the first lateral area of the projection, producing a gate electrode adjoining the gate dielectric, producing and patterning a conductive layer to adjoin the gate electrode, to adjoin the second lateral area of the projection in a region of the body region, and to conductively connect the gate electrode and the second lateral area to one another.

In accordance with yet an added mode of the invention, the projection is provided with two further lateral areas opposite one another with respect to the projection, each of the two further lateral areas are provided with an insulation, and the conductive layer is patterned to laterally surround the projection and to be isolated from the two further lateral areas by the respective insulation.

In accordance with yet an additional mode of the invention, there are provided the steps of applying an auxiliary layer on the substrate, patterning the auxiliary layer with a first strip-type mask, etching uncovered parts of the substrate and, thereby, producing at least one strip-type projection of the substrate, the strip-type projection having lateral areas, forming an insulating layer on the substrate, forming the gate dielectric on the lateral areas of the strip-type projections by thermal oxidation, depositing conductive material to be used as a gate electrode and etching back the conductive material to a point below the auxiliary layer, etching, with the aid of a second strip-type mask running transversely with respect to the strip-type projection, at least the auxiliary layer, the conductive material, and the strip-type projection to produce the projection from the strip-type projection, depositing insulating material to adjoin the two further lateral areas of the projection, removing uncovered parts of the auxiliary layer with the aid of a third mask, the third mask not covering the patterned auxiliary layer in a region of the second lateral area of the projection, enlarging the auxiliary layer with spacers by depositing material and etching back the material to place the spacers on conductive material in a region of the first lateral area of the projection, on the insulating material in regions of the two further lateral areas, and on the projection in a region of the second lateral area, selectively etching the insulating material and the conductive material with respect to the auxiliary layer until the insulating layer is uncovered to form the gate electrode from the conductive material below the auxiliary layer, to form the insulation of each of the two further lateral areas from the insulating material below the auxiliary layer, and to uncover the second lateral area of the projection, and depositing conductive material and etching back the conductive material to produce the conductive layer.

With the objects of the invention in view, there is also provided a method for fabricating a DRAM cell configuration, including the steps of producing memory cells each having a MOS transistor produced by forming a substrate with a projection having a first lateral area, a second lateral area disposed opposite the first lateral area with respect to the projection, and two further lateral areas opposite one another with respect to the projection, each of the two further lateral areas having an insulation, producing, in the projection as layers stacked one above the other, an upper source/drain region, a body region, and a lower source/drain region of a MOS transistor, providing a gate dielectric at the first lateral area of the projection, producing a gate electrode adjoining the gate dielectric, producing and patterning a conductive layer to adjoin the gate electrode, to adjoin the second lateral area of the projection in a region of the body region, and to conductively connect the gate electrode and the second lateral area to one another, and patterning the conductive layer to laterally surround the projection and to be isolated from the two further lateral areas by the respective insulation, and a capacitor connected to the MOS transistor, producing a plurality of strip-type projections with a first strip-type mask having a plurality of strips running substantially parallel to one another, producing a plurality of projections disposed in rows and columns with a second mask having a plurality of strips running substantially parallel to one another and transversely with respect to the strips of the first mask, and after depositing and etching back conductive material for producing the conductive layer, patterning the conductive material with the aid of a third strip-type mask having strips wider than a respective one of the projections and respectively covering projections disposed adjacent one another along one of the columns to thereby produce word lines running parallel to the columns and including the conductive structure and the gate electrode of each MOS transistor.

In accordance with a concomitant mode of the invention, the capacitor has a capacitor dielectric and a storage note, and there are provided the steps of producing the lower source/drain region to place a part of the lower source/drain region below the projection and adjoining a surface of the substrate, during a production of the projection, also etching the substrate to produce isolation trenches running transversely with respect to the word lines and to isolate, with the isolation trenches, a lower source/drain region of one of the memory cells disposed adjacent to another lower source-drain region of another of the memory cells transversely with respect to the isolation trenches from one another, producing a depression in the substrate between two mutually adjacent isolation trenches, the depression having the capacitor dielectric and an upper region and being filled with the storage node, the storage node adjoining a part of the lower source/drain region in the upper region of the depression, and after production of the capacitor, producing the word lines with the aid of the third strip-type mask to produce further isolation trenches, the further isolation trenches running transversely with respect to the isolation trenches, cutting through the upper region of the depression of the memory cells, and being disposed offset with respect to the depression of the memory cells such that the storage node of a given memory cell of the memory cells adjoins a lower source/drain regions of the given memory cell in the upper region of the depression in the given memory cell.

So that the MOS transistor has a particularly small space requirement, it is advantageous to fabricate the MOS transistor as set forth in the following text.

The projection is produced with the aid of a patterned auxiliary layer that serves as a mask. To that end, the substrate is etched selectively with respect to the auxiliary layer. The gate dielectric is produced such that it adjoins at least the first lateral area of the projection. Before or after the production of the gate dielectric, insulating material is deposited such that the insulating material adjoins the two further lateral areas of the projection. Conductive material is deposited such that the conductive material adjoins the first lateral area provided with the gate dielectric. For the method, it is unimportant whether insulating material or conductive material adjoins the second lateral area of the projection and whether or not the second lateral area is provided with the gate dielectric. As explained further below, it is advantageous for the purpose of process simplification if conductive material adjoins the second lateral area of the projection, which lateral area is provided with the gate dielectric. Afterward, a horizontal cross-section of the patterned auxiliary layer is reduced in size starting from the second lateral area of the projection. The reduction can be done with the aid of a mask that is disposed offset with respect to the patterned auxiliary layer and with which the auxiliary layer is etched. Afterward, the auxiliary layer is enlarged again by spacers by depositing material and etching it back. The previous reduction of the size of the patterned auxiliary layer and the thickness of the spacers are coordinated with one another such that the spacer, in the region of the second lateral area, is disposed exclusively on the projection and not on the material adjoining it. The spacer in the region of the first lateral area of the projection is disposed on the conductive material. The spacers in the regions of the two further lateral areas are disposed on the insulating material. The auxiliary layer enlarged by the spacers serves as a mask during an etching step in which the insulating material and the conductive material are etched. The gate electrode is thereby formed from the conductive material below the spacer in the region of the first lateral area of the projection. The insulations are formed from the insulating material below the spacers in the regions of the two further lateral areas of the projection. The second lateral area of the projection is uncovered during the etching process because the spacer in the region of the second lateral area of the projection is disposed exclusively on the projection. Afterward, conductive material is deposited and etched back, thereby producing the conductive structure.

The deposition of the conductive material after the production of the gate electrode and the deposition of the insulating material can be effected as set forth in the following text.

The auxiliary layer is applied on the substrate. The auxiliary layer is patterned with the aid of a first strip-type mask. Uncovered parts of the substrate are etched with the aid of the first mask, thereby producing at least one strip-type projection of the substrate. To insulate the gate electrode and the conductive structure from the substrate, an insulating layer is applied to the substrate. Afterward, the gate dielectric is produced. The conductive material is deposited and etched back to a point below the auxiliary layer. With the aid of second strip-type mask, which runs transversely with respect to the strip-type projection, at least the auxiliary layer, the conductive material, and the strip-type projection are etched such that the projection is produced from the strip-type projection. After the process step, the first lateral area and the second lateral area of the projection are adjoined by the gate dielectric and, adjoining the latter, the conductive material. The two further lateral areas of the projection are uncovered. Afterward, the insulating material is deposited, so that it adjoins the two further lateral areas of the projection. Afterward, as described above, the patterned auxiliary layer is further reduced in size with the aid of the mask that is referred to as "third mask" below.

Within the scope of the invention is the deposition of the insulating material after the production of the strip-type projection and before the production of the projection, and the deposition of the gate dielectric and the conductive material after the production of the projection.

To ensure that the third mask covers the patterned auxiliary layer in the regions of the two further lateral areas of the projection, the mask may be in strip form and correspond to the first mask but be situated offset with respect to the first mask.

The MOS transistor can be used in a DRAM cell configuration that likewise solves the problem on which the invention is based. The DRAM cell configuration has memory cells that each have a MOS transistor having the features described above and a capacitor connected to the MOS transistor. The projections of the MOS transistors are disposed in rows and columns. The conductive layers and the gate electrodes of the MOS transistors that are disposed along one of the columns are parts of a word line running parallel to the column.

Such a DRAM cell configuration can be fabricated in accordance with a method according to the features set forth above.

The conductive structures adjoin one another in the direction of the columns.

The lower source/drain region may be configured such that a part of the lower source/drain region protrudes laterally below the projection and adjoins a surface of the substrate. Such a lower source/drain region can be connected more easily to the capacitor.

The capacitor is disposed, e.g., above the substrate.

As an alternative, a depression is provided in the substrate, which depression is provided with a capacitor dielectric of the capacitor and is filled with a storage node of the capacitor. The capacitor dielectric does not completely cover areas of the depression so that the storage node can adjoin that part of the lower source/drain region that is disposed below the projection in an upper region of the depression.

So that lower source/drain regions of different MOS transistors are isolated from one another, isolation trenches that run essentially parallel to one another are provided. Through the isolation trenches, the lower source/drain regions that are adjacent to one another transversely with respect to the isolation trenches are isolated from one another. The depression is disposed between two mutually adjacent isolation trenches. The depression can be produced before or after the production of the isolation trenches.

For the purpose of process simplification, the isolation trenches are preferably produced during the production of the projections. To that end, the substrate is also etched during the production of the projections from the strip-type projections.

The lower source/drain regions that are adjacent to one another along the isolation trenches may be isolated from one another by the depressions of the capacitors of the memory cells.

As an alternative, further isolation trenches that run transversely with respect to the isolation trenches are provided.

The lower source/drain regions may be produced by patterning of a doped layer in the substrate. The patterning is effected by the production of the isolation trenches and of the depressions or the further isolation trenches. The doped layer may be produced, e.g., by deep implantation of the substrate before the production of the projections. As an alternative, the doped layer is produced by epitaxi.

So that the storage node adjoins only the associated lower source/drain region, and not a further lower source/drain region of an adjacent memory cell, the capacitor dielectric or an insulating protective layer can be produced such that it has a cutout only in the region of the associated lower source/drain region, in the case of which cutout the storage node adjoins the lower source/drain region. To produce such a capacitor dielectric or such an insulating protective layer, the capacitor dielectric or the insulating protective layer firstly covers the entire upper region of the depression. With the aid of a mask that covers a part of the upper region, the capacitor dielectric or the insulating protective layer is etched, so that the cutout is produced only in the region of the associated lower source/drain region.

As an alternative, the storage node may initially adjoin the substrate in the entire upper region so that it also adjoins the lower source/drain region of the MOS transistor of an adjacent memory cell. The further isolation trenches are subsequently produced such that they cut through the upper regions of the depressions but are disposed offset with respect to the depressions so that the storage nodes adjoin only the associated lower source/drain regions in the upper regions of the depressions.

For the purpose of process simplification, it is advantageous if the further isolation trenches are produced during the production of the word lines. To that end, the conductive material for producing the conductive structures or the word lines is patterned with the aid of a fourth strip-type mask, the insulating layer, the substrate, the storage node, and the capacitor dielectric or the protective layer being etched in addition to the conductive material.

In the method described, the isolation trenches are produced such that they run along the rows. In such a case, the first lateral area of the projection essentially lies in a plane in which the direction of the column lies.

However, it lies within the scope of the invention to produce the isolation trenches such that they each run along one of the columns.

An alternative that is independent thereof lies in producing the DRAM cell configuration such that the first lateral area of the projection essentially lies in a plane in which the direction of the row lies.

To increase the packing density, it is advantageous if the projections have a horizontal cross-section that is square with a side length that corresponds to the minimum feature size F that can be fabricated in the technology used. The isolation trenches, too, preferably, have a width corresponding to the minimum feature size F. The same applies to the width of the further isolation trenches.

The upper source/drain region can be produced from a further doped layer that is patterned during the production of the projection. The further doped layer can be produced by implantation or by epitaxi. The upper source/drain region can be produced after the production of the projection by implantation.

Other features that are considered as characteristic for the invention are set forth in the appended claims.

Although the invention is illustrated and described herein as embodied in a MOS Transistor and method for fabricating it, and DRAM Cell configuration and method for fabricating it, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a fragmentary, plan view of a substrate having depressions, a first mask, and strip-type projections according to the invention;

FIG. 2 is a fragmentary, cross-sectional view through the substrate of FIG. 1 after the production of the depressions, a capacitor dielectric of capacitors, storage nodes of capacitors, the strip-type projections, an auxiliary layer, an insulating layer, a gate dielectric of MOS transistors, and a layer made of polysilicon according to the invention;

FIG. 3 is a fragmentary, plan view of FIG. 1 after the production of a second mask, isolation trenches, projections, and upper source/drain regions according to the invention;

FIG. 4A is a fragmentary, cross-sectional view of FIG. 2 after the process steps of FIG. 3 and after the production of a third mask, spacers, gate electrodes of the MOS transistors, and insulations according to the invention;

FIG. 4B is a fragmentary, plan view of FIG. 3 after the process steps of FIG. 4a showing the spacers, the auxiliary layer, the third mask, and the isolation trenches according to the invention;

FIG. 5 is a fragmentary, cross-sectional view of FIG. 4A after the production of a further insulating layer, a first conductive layer, and a second conductive layer according to the invention;

DESCRIPTION OF THE PREFERRED EMBODIMENTS

Figure 6A:
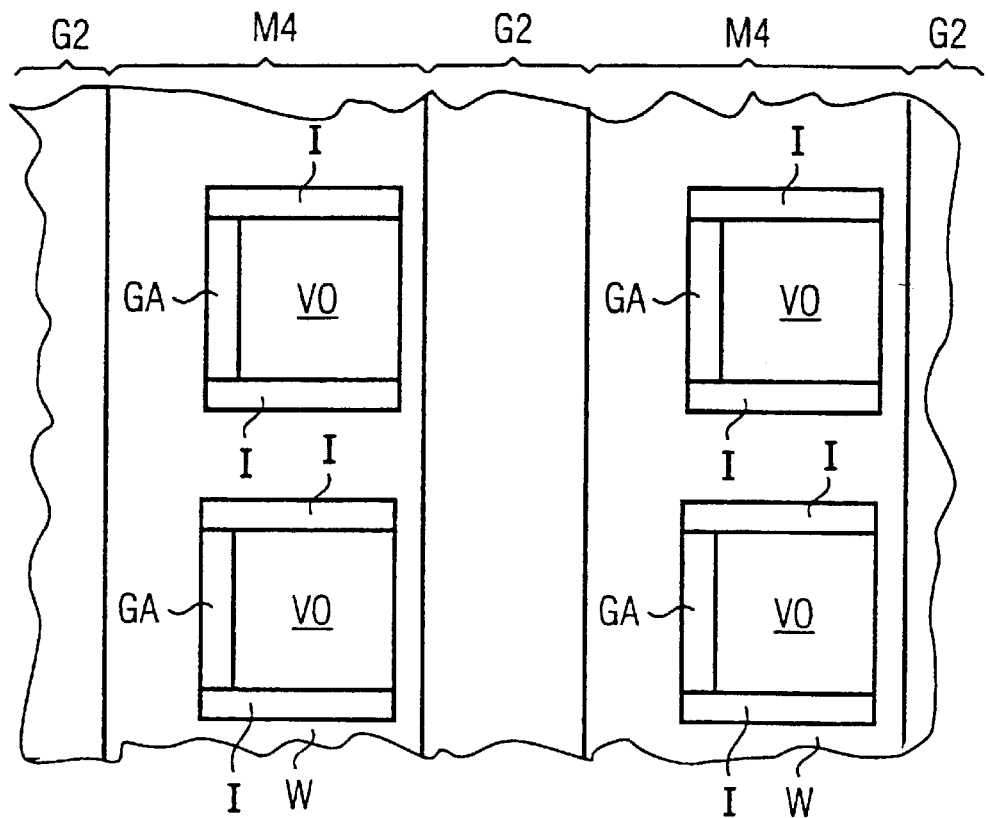
FIG. 6A is a plan view of FIG. 4B after the production of a fourth mask, further isolation trenches, lower source/drain regions of the MOS transistors, conductive structures, word lines, and an intermediate oxide according to the invention showing the projections, the insulations of FIG. 4A, the gate electrodes, the word lines, and the further isolation trenches.

Referring now to the figures of the drawings in detail, which are not to scale, and first, particularly to FIGS. 1 and 2 thereof, there is shown a substrate 1 made of silicon is provided in the exemplary embodiment. The substrate 1 has a lower doped layer U having a thickness of approximately 200 nm and an upper doped layer O having a thickness of approximately 100 nm, which are n-doped and have a dopant concentration of approximately $10^{19}$ cm$^{-3}$. The rest of the substrate 1 is essentially p-doped and has a dopant concentration of approximately $10^{17}$ cm$^{-3}$. The lower layer U is at a distance of approximately 300 nm from the upper layer O.

An auxiliary layer H having a thickness of 150 nm is produced by deposition of silicon nitride to a thickness of approximately 150 nm.

Depressions V having a depth of approximately 7 μm are produced in the substrate 1 by masked etching. The depressions V are disposed in columns and rows. See FIG. 1. The depressions V have a horizontal cross-section that is essentially circular and has a diameter of approximately 150 nm. Depressions V that are adjacent to one another along a column are at a distance of approximately 150 nm from one another. Depressions V that are adjacent to one another along a row are at a distance of approximately 300 nm from one another.

A capacitor dielectric KD of capacitors is produced in the depressions V by deposition of silicon nitride to a thickness of 4 nm and then oxidation with a depth of approximately 2 nm. Afterward, lower regions of the depressions V are filled by deposition of doped polysilicon and etching-back. Uncovered parts of the capacitor dielectric are removed so that upper regions of the depressions V are not provided with the capacitor dielectric KD.

The depressions V are completely filled by deposition of further doped polysilicon. In the upper regions of the depressions V, the doped polysilicon adjoins the substrate 1. The doped polysilicon in the depressions V forms storage nodes K of the capacitors. See FIG. 2.

With the aid of a first strip-type mask M1 made of photoresist, whose strips have a width of approximately 150 nm, run parallel to the columns and are at a distance of approximately 300 nm from one another, the auxiliary layer H is patterned. See FIGS. 1 and 2. The strips of the first mask M1 are at a distance of approximately 75 nm from the depressions V.

The patterned auxiliary layer H serves as a mask in an etching step in which polysilicon and the substrate are etched selectively with respect to silicon nitride, thereby producing strip-type projections VS. See FIGS. 1 and 2. The strip-type projections VS have a height of approximately 450 nm. In a high density plasma (HDP) method, SiO$_2$ is deposited non-conformably and then etched isotropically so that a first insulating layer I1 having a thickness of approximately 50 nm is produced on a surface S of the substrate 1. See FIG. 2.

A gate dielectric GD of MOS transistors is produced on lateral areas of the strip-type projections VS by thermal oxidation. See FIG. 2.

Afterward, in-situ n-doped polysilicon is deposited to a thickness of approximately 500 nm, planarized by chemical mechanical polishing and then etched back, thereby producing a layer P made of polysilicon and having a thickness of approximately 250 nm. See FIG. 2.

With the aid of a second strip-type mask M2 made of a photoresist, whose strips have a width of approximately 150 nm, are at a distance of approximately 150 nm from one another, run along the rows, and cover the depressions V, silicon nitride, silicon, polysilicon, and $SiO_2$ are etched. See FIG. 3. The process produces first isolation trenches G1 that extend from the surface S of the substrate 1 to a depth of approximately 250 nm into the substrate and, consequently, cut through the lower doped layer U. In such a case, the auxiliary layer H is also patterned. Furthermore, projections VO having a square cross-section that is horizontal, that is to say, runs parallel to the surface S of the first substrate 1, with a side length of approximately 150 nm are produced from the strip-type projections VS. The projections VO are disposed in rows and columns. See FIG. 3. The projections VO that are adjacent to one another along a column are at a distance of approximately 150 nm from one another and are isolated from one another by the first isolation trenches G1. The projections VO that are adjacent to one another along a row are at a distance of approximately 300 nm from one another. The depressions V and the projections VO are disposed alternately next to one another along a row. The projections VO each have a first lateral area F1 and an opposite second lateral area F2 that are adjoined by the gate dielectric GD and, adjoining the gate dielectric GD, the layer made of polysilicon P. The projections VO furthermore have two further lateral areas that are opposite one another and are adjoined by the $SiO_2$ in the first isolation trenches G1. The first lateral areas F1 of the projections VO essentially each lie in a plane in which the direction of the associated column lies.

Upper source/drain region S/DO of the MOS transistors are produced from the upper doped layer O. See FIG. 4A.

The first isolation trenches G1 are filled with $SiO_2$ by depositing $SiO_2$ to a thickness of approximately 100 nm and subjecting to chemical mechanical planarization until the auxiliary layer is uncovered.

With the aid of a third strip-type mask M3 made of photoresist, which corresponds to the first mask M1 and is offset with respect to the first mask M1 such that it partly covers the patterned auxiliary layer H, uncovered parts of the auxiliary layer H are removed using, for example, $CHF_3$. See FIGS. 4A and 4B. As a result, the patterned auxiliary layer H is further reduced in size.

Afterward, the auxiliary H is enlarged by spacers SP. The spacers SP are produced by depositing silicon nitride to a thickness of approximately 30 nm and etching back.

The spacers SP that are disposed in regions of the first lateral areas F1 of the projections VO are disposed on the layer made of polysilicon P. See FIG. 4A. The spacers SP that are disposed in the regions of the second lateral areas F2 of the projections VO are disposed on the projections VO. See FIG. 4A. The spacers SP that are disposed in regions of the further lateral areas of the projections VO are disposed on the $SiO_2$ in the first isolation trenches G1. See FIG. 4B.

Afterward, with the aid of the auxiliary layer H enlarged by the spacers SP as a mask, $SiO_2$ is etched to a depth of approximately 400 nm. As a result, insulations I are produced below the spacers SP that are disposed in the regions of the further lateral areas of the projections VO. See FIG. 6A. In the first isolation trenches G1, the $SiO_2$ still remains with a thickness of approximately 300 nm.

Afterward, with the aid of the auxiliary layer H enlarged by the spacers P as a mask, the layer made of polysilicon P is etched until the first insulating layer I1 is uncovered. As a result, gate electrodes GA of the MOS transistors are produced below the spacers SP that are disposed in the regions of the first lateral areas F1 of the projections VO. See FIGS. 4A and 6A.

The gate dielectric GD is removed from the second lateral areas F2 of the projections Vo by isotropic etching using HF, for example.

To produce a second insulating layer I2 having a thickness of approximately 400 nm, $SiO_2$ is deposited to a thickness of approximately 50 nm and etched back. See FIG. 5. To produce a conductive layer L1, in-situ-doped polysilicon is deposited to a thickness of approximately 50 nm and etched back. To produce a second conductive layer L2 having a thickness of approximately 100 nm, tungsten silicide is deposited to a thickness of approximately 400 nm and etched back. See FIG. 5.

Afterward, a fourth strip-type mask M4 made of photoresist is produced, whose strips have a width of approximately 300 nm and are at a distance of approximately 150 nm from one another and run parallel to the columns and respectively cover the projections VO that are adjacent to one another along a column. See FIG. 6A. The second conductive layer L2, the first conductive layer L1, the second insulating layer I2, the first insulating layer I1, the storage nodes K, the capacitor dielectrics KD, and the substrate 1 are etched with the aid of the fourth mask M4, thereby producing second isolation trenches G2, which run transversely with respect to the first isolation trenches G1 and cut through the upper regions of the depressions V. The second isolation trenches G2 extend approximately 250 nm from the surface S of the first substrate 1 into the first substrate 1.

The lower doped layer U is patterned by the production of the isolation trenches G1, the second isolation trenches G2, and the depressions V, thereby producing mutually isolated lower source/drain regions S/DU of the MOS transistors. Parts of the substrate 1 that are disposed between the upper source/drain regions S/DO and the lower source/drain regions S/DU act as channel regions KA of the MOS transistors.

The second isolation trenches G2 are disposed offset with respect to the depressions V such that the storage nodes K adjoin the associated lower source/drain regions S/DU in the upper regions of the depressions V.

Figure 6B:
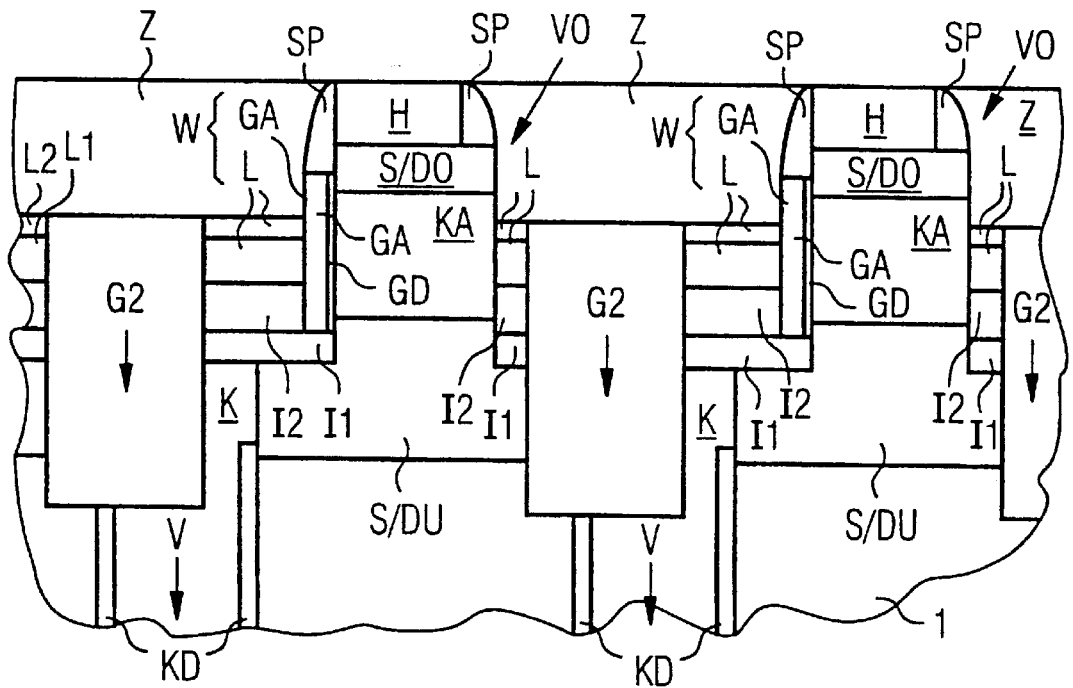
FIG. 6b is a fragmentary, cross-sectional view of FIG. 5 after the process steps of FIG. 6A.

Conductive structures L are produced from the second conductive layer L2 and the first conductive layer L1 by the production of the second isolation trenches G2, which structures L respectively surround one of the projections VO, adjoin the associated second lateral area F2 of the projection VO, adjoin the associated gate electrode GA and, together with the gate electrodes GA form word lines W running parallel to the columns. See FIGS. 6B and 6A.

The second insulating layer I2 prevents a short circuit between the lower source/drain regions S/DU and the conductive structures L.

An intermediate oxide Z is produced by depositing $SiO_2$ to a thickness of approximately 1000 nm and etching back until the auxiliary layer H is uncovered. The second isolation trenches G2 are filled with $SiO_2$ in the process. See FIG. 6B.

Conventional method steps are then used to open contact holes to the upper source/drain regions S/DO, to produce contacts therein and to produce bit lines that run transversely with respect to the word lines W and adjoin the non-illustrated contacts.

The conductive structures L connect the channel regions KA to the associated gate electrodes GA.

There are many conceivable variations of the exemplary embodiment that likewise lie within the scope of the invention. Thus, dimensions of the layers, depressions, projections and masks can be adapted to the respective requirements. The same applies to the choice of materials.

We claim:

1. A MOS transistor, comprising:

a substrate;

an upper source/drain region;

a body region;

a lower source/drain region;

said upper source/drain region, said body region, and said lower source/drain region stacked as layers one above another and forming a projection of said substrate;

said projection having:
   a first lateral area; and
   a second lateral area disposed opposite said first lateral area with respect to said projection;

a gate dielectric adjoining said first lateral area;

a gate electrode adjoining said gate dielectric;

a patterned conductive structure:
   adjoining said second lateral area at a portion of said body region; and
   adjoining said gate electrode; and said conductive structure forming a conductive connection between said body region and said gate electrode.

2. The MOS transistor according to claim 1, wherein:

said projection has two further lateral areas each opposite one another with respect to said projection;

said two further lateral areas each have an insulation;

said conductive structure is patterned to laterally surround said projection; and said insulation isolates said conductive structure from said two further lateral areas.

3. The MOS transistor according to claim 1, wherein said conductive structure is a conductive layer.

4. A DRAM cell configuration, comprising:

memory cells each having:
   a MOS transistor having:
      a substrate;
      an upper source/drain region;
      a body region;
      a lower source/drain region;
      said upper source/drain region, said body region, and said lower source/drain region stacked as layers one above another and forming a projection of said substrate;
      said projection having:
         a first lateral area;
         a second lateral area disposed opposite said first lateral area with respect to said projection;
         a third lateral area having an insulation; and
         a fourth lateral area having an insulation, said fourth lateral area disposed opposite said third lateral area with respect to said projection;
      a gate dielectric adjoining said first lateral area;
      a gate electrode adjoining said gate dielectric;
      a patterned conductive structure:
         laterally surrounding said projection;
         isolated from said third and fourth lateral areas by said insulation;
         adjoining said second lateral area at a portion of said body region; and
         adjoining said gate electrode; and
      said conductive structure forming a conductive connection between said body region and said gate electrode; and
   a capacitor connected to said MOS transistor;

said projection of each of said memory cells disposed in rows and columns;

a word line running parallel to said columns, said word line having parts; and said parts including said conductive structure and said gate electrode of said MOS transistor of said memory cells disposed along a respective one of said columns.

5. The DRAM cell configuration according to claim 4, wherein:

said substrate has a surface;

said lower source/drain region has a portion;

said portion is disposed below said projection and adjoins said surface;

isolation trenches run substantially parallel to one another;

said isolation trenches isolate said lower source/drain region of one of said memory cells adjacent another of said lower source/drain region of another of said memory cells transversely with respect to said isolation trenches;

said substrate has a depression between two mutually adjacent ones of said isolation trenches;

said capacitor has a capacitor dielectric and a storage node; said depression:
   has an upper region;
   includes said capacitor dielectric; and
   is filled with said storage node; and said storage node adjoins said portion of said lower source/drain region in said upper region of said depression.

6. The DRAM cell configuration according to claim 5, wherein said lower source/drain regions adjacent to one another along said isolation trenches are isolated from one another by said depression.

7. The DRAM cell configuration according to claim 5, including further isolation trenches, said further isolation trenches:

running transversely with respect to said isolation trenches;

cutting through said upper region of said depression of said memory cells; and being disposed offset with respect to said depression of said memory cells such that said storage node of a given memory cell of said memory cells adjoins said lower source/drain region of said given memory cell in said upper region of said depression in said given memory cell and said storage node is isolated from said substrate.

8. The DRAM cell configuration according to claim 5, wherein:

each of said isolation trenches runs along one of said rows;

each of said columns extend in a given direction; and said first lateral area substantially lies in a plane disposed in said given direction.

* * * * *